(12) United States Patent
Cann

(10) Patent No.: US 6,486,744 B1
(45) Date of Patent: Nov. 26, 2002

(54) LOW PHASE NOISE VOLTAGE-CONTROLLED OSCILLATOR AND METHOD OF USING THE SAME

(75) Inventor: Michael John Cann, Lower Hutt (NZ)

(73) Assignee: Digital Microwave Corporation, San Jose, CA (US)

( * ) Notice: Subject to any disclaimer, the term of this patent is extended or adjusted under 35 U.S.C. 154(b) by 0 days.

(21) Appl. No.: 09/859,837

(22) Filed: May 16, 2001

(51) Int. Cl.[7] ................................................ H03B 5/18
(52) U.S. Cl. ....................... 331/117 D; 331/96; 331/99; 331/107 DP; 331/107 SL; 331/117 R; 331/177 V; 333/235
(58) Field of Search ................................ 331/36 C, 96, 331/99, 100, 107 A, 107 DP, 107 SL, 117 R, 117 FE, 117 D, 177 R, 177 V; 333/235

(56) References Cited

U.S. PATENT DOCUMENTS 3,818,389 A  *  6/1974  Fisher ...................... 333/73 R
4,028,648 A  *  6/1977  Hartmann et al. ............. 333/72
4,266,208 A  *  5/1981  Cornish ...................... 333/218
5,216,392 A  *  6/1993  Fraser et al. ................ 333/17.3

OTHER PUBLICATIONS

Bahl, Inder et al., "Microwave Solid State Circuit Design", Gallium Arsenide Technology Center, A Wiley–Interscience Publication, 2 sheets and pp. 426–435, 456–467, 1988.

Vidmar, Matjaz, University of Ljubljana, Microwave Journal, Jun. 1999, "A Wideband, Varactor–tuned Microstrip VCO", 1 sheet and pp 10, 80, 82, 84 & 86.

* cited by examiner

Primary Examiner—David Mis
(74) Attorney, Agent, or Firm—James S. Hsue; Skjerven Morrill LLP (57) ABSTRACT

A low phase noise voltage-controlled oscillator (VCO) and method are provided. The VCO comprises a negative resistance generator and a resonator that reduces VCO phase noise.

22 Claims, 6 Drawing Sheets

LOW PHASE NOISE VOLTAGE-CONTROLLED OSCILLATOR AND METHOD OF USING THE SAME

BACKGROUND OF THE INVENTION

1. Field of the Invention

The present invention relates to electronic circuits, and more particularly a voltage-controlled oscillator.

2. Description of the Related Art

Wireless communication needs worldwide have increased dramatically in the last few years, particularly in the amount of devices being used and the demand for higher data rates. The amount of available radiofrequency (RF) spectrum is limited, and the result has been an incredible increase in the licensing costs for specific frequency bands. The limited frequency spectrum has prompted telecommunication equipment manufacturers to either decrease the amount of bandwidth required for a specific data rate or to increase the data rate while staying within a specified bandwidth.

The highest data rate that a RF communication system can handle is generally determined by the type of modulation scheme used by the communication system. One of the most spectrally-efficient modulation schemes currently available is Quadrature Amplitude Modulation (QAM). There are many parameters in a RF system that can limit the order of QAM used. One of the main parameters is 'phase noise.' A high proportion of phase noise is generated by local oscillators (LOs) used in frequency conversion in a RF system. Many local oscillators use a voltage-controlled oscillator (VCO) within a phase locked loop (PLL) to generate a highly stable local oscillation with low phase noise.

SUMMARY OF THE INVENTION

A low phase noise voltage-controlled oscillator (VCO) is provided in accordance with the present invention. In one embodiment, the VCO comprises a negative resistance generator and a resonator structure that reduces VCO phase noise. The VCO uses the reflection properties of the resonator.

An advantage of one embodiment of the VCO is its relatively low cost of manufacture compared to other VCOs. Another advantage of one embodiment of the VCO is its high performance capability.

Another advantage of one embodiment of the VCO is its lower phase noise compared to conventional microstrip resonators. In one embodiment, low phase noise performance is achieved by tuning the outside fingers of an interdigital filter resonator in the VCO and configuring suitable physical dimensions of the resonator.

One aspect of the invention relates to a voltage-controlled oscillator comprising a resonator and a negative resistance generator. The resonator comprises a three-finger interdigital filter and a plurality of varactors. A first varactor is coupled to a first finger of the interdigital filter and a ground terminal. A second varactor is coupled to a third finger of the interdigital filter and a ground terminal. A second finger of the interdigital filter is coupled to a ground terminal. The first and second varactors are configured to alter a resonant frequency of the interdigital filter to a desired frequency in response to a tuning voltage applied to the resonator.

The negative resistance generator is coupled to the resonator. The negative resistance generator is configured to receive a first signal with a particular frequency from the resonator. The negative resistance generator is configured to output a second signal with a substantially similar frequency and a higher amplitude compared to the first signal.

Another aspect of the invention relates to a method of generating an oscillating signal at a desired frequency. The method comprises applying a tuning voltage to a resonator. The resonator comprises an interdigital filter and a plurality of varactors. The interdigital filter comprises a first finger, a second finger and a third finger. The first finger is coupled to a first varactor, and the third finger is coupled to a second varactor. The method further comprises using the tuning voltage to alter a resonant frequency of the interdigital filter to generate a signal with a desired oscillation frequency.

DETAILED DESCRIPTION

Figure 1:
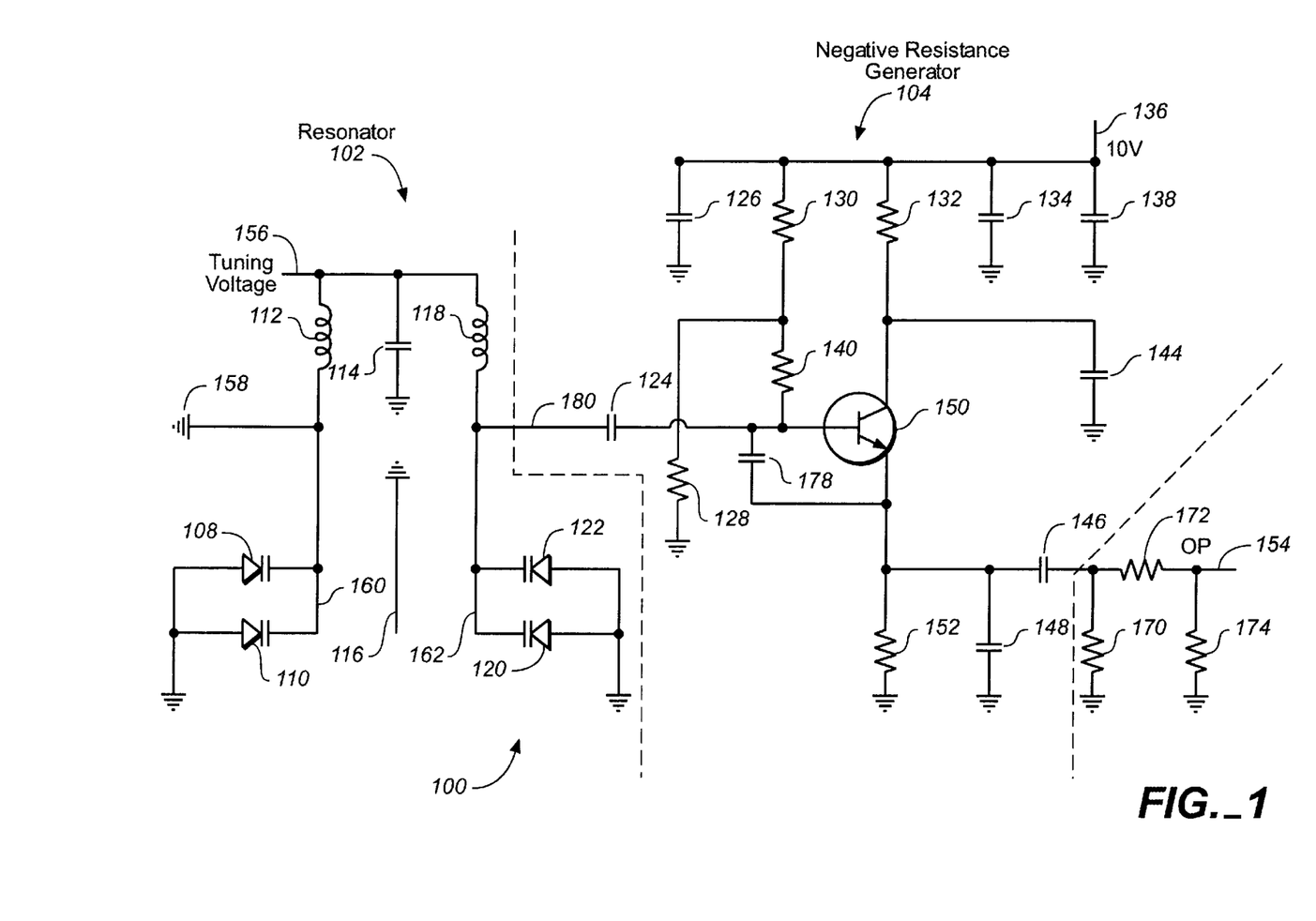
FIG. 1 illustrates one embodiment of a voltage-controlled oscillator (VCO).

FIG. 1 illustrates one embodiment of a voltage-controlled oscillator (VCO) 100.

The VCO 100 of FIG. 1 comprises a resonator 102 and a negative resistance generator 104. In general, a resonator is a device that has been configured to provide oscillation at a particular frequency or range of frequencies.

Resonator

Structurally, the resonator 102 in FIG. 1 comprises a first inductor 112, a first capacitor 114, a second inductor 118, a first voltage-variable capacitor (varactor) diode 108, a second varactor diode 110, a first interdigital filter finger 160, a second interdigital filter finger 116, a third interdigital filter finger 162, a third varactor diode 122 and a fourth varactor diode 120. The first, second and third interdigital filter fingers 160, 116, 162 function as an interdigital filter.

In one embodiment, the first inductor 112 comprises a 22-nanohenry (nH) Coilcraft 0805HS Series inductor, the first capacitor 114 comprises a 10-picofarad (pF) ATC600S capacitor, and the second inductor 118 comprises a 22-nH Coilcraft 0805HS Series inductor.

In one embodiment, the first, second, third and fourth varactor diodes 108, 110, 122, 120 in FIG. 1 comprise silicon varactor diodes. In another embodiment, the first, second, third and fourth varactor diodes 108, 110, 122, 120 comprise GaAs varactor diodes. In one embodiment, the first, second, third and fourth varactor diodes 108, 110, 122, 120 comprise Toshiba 1SV285 varactor diodes.

In one embodiment, the first interdigital filter finger 160 in FIG. 1 comprises a 1.2 mm×21 mm microstrip 50 ohm track, the second interdigital filter finger 116 comprises a 2.5 mm×21 mm microstrip 30 ohm track, and the third interdigital filter finger 162 comprises a 1.2 mm×21 mm microstrip 50 ohm track. In another embodiment, the length of the first and third interdigital filter fingers is 21.3 mm. In one embodiment, the three interdigital filter fingers 160, 116, 162 are separated by a spacing of 0.18 mm. In other embodiments, the resonator 102 may comprise interdigital filter fingers with other dimensions and spacings. In one embodiment, all microstrip tracks are implemented on a 0.5 mm teflon substrate. The interdigital filter fingers 160, 116, and 162 are used to determine the frequency of the oscillator 100.

In FIG. 1, the second varactor diode 110 is coupled to an end of the first interdigital filter finger 160 and a ground terminal, and the fourth varactor diode 120 is coupled to an end of the third interdigital filter finger 162 and a ground terminal. The first and third varactor diodes 108, 122 are coupled to the first and third interdigital filter fingers 160, 162, respectively, and ground terminals. The configuration of some or all of the varactor diodes 108, 110, 122, 120 between the first and third interdigital filter fingers 160, 162 and ground allows the first and third interdigital filter fingers 160, 162 to be tuned. This configuration also removes the need for additional RF bypassing and decoupling circuitry.

The open-circuit ends of the first and third interdigital filter fingers 160, 162 are coupled to the first and second inductors 112, 118, which act as radiofrequency (RF) chokes. In general, a RF choke is a low-inductance coil used to block RF alternating currents. The first and second inductors 112, 118 are both RF decoupled with the first capacitor 114.

In operation, a tuning voltage in the range of about 0V to about 6V is applied across the first inductor 112 at points 156, 158 of the resonator 102. The first and second inductors 112, 118 apply the same tuning voltage to the two outside interdigital filter fingers 160, 162 and the four varactor diodes 108, 110, 122, 120. The capacitance of each varactor 108, 110, 120, 122 is set by the tuning voltage. The capacitance alters the resonant frequency of the interdigital filter, which comprises the three fingers 160, 116, 162. The tuning voltage is used to adjust the frequency of an output signal at a point 154 in the negative resistance generator 104 (described below).

The interdigital filter fingers 160, 116 and 162 are a key to achieving low phase noise performance. In one embodiment, low phase noise performance is achieved by (1) tuning the varactor diodes 108, 110 by applying a tuning voltage in the range of about 0V to about 6V to the first and third interdigital filter fingers 160, 162 and (2) configuring suitable physical dimensions of the resonator 102. In one embodiment, a tuning range of about 380 MHz is achieved.

Figure 2:
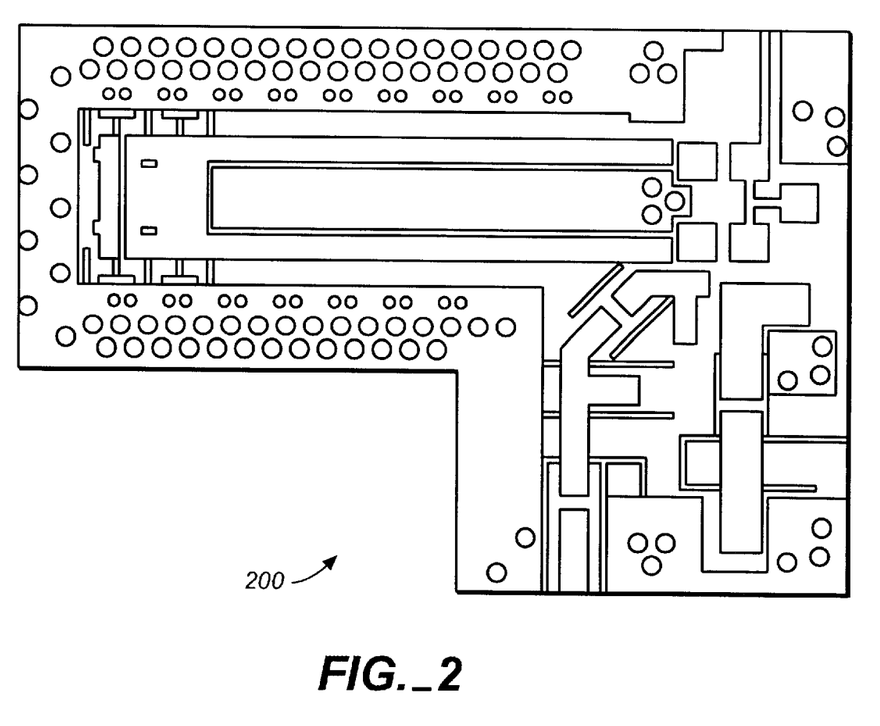
FIG. 2 illustrates one embodiment of a circuit layout of the VCO of FIG. 1.

FIG. 2 illustrates one embodiment of a circuit layout 200 of the VCO 100 of FIG. 1. In one embodiment, the circuit 200 comprises a microstrip circuit that is etched on a 0.5 mm-thick, double-sided, teflon laminate. The resonator 102 of FIG. 1 may be observed as a one-port network, such as the networks 300, 310, 320 in FIGS. 3A–3C.

Figure 3A:
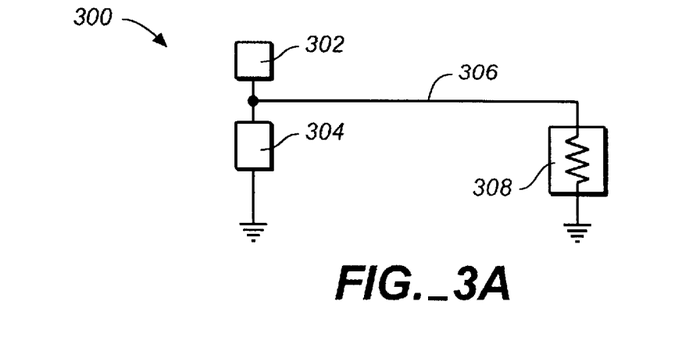
FIG. 3A illustrates an Advanced Design System (ADS) schematic of one embodiment of a single quarter-wave resonator network.

FIG. 3A illustrates an Advanced Design System (ADS) schematic of one embodiment of a single quarter-wave resonator network 300. ADS is a software circuit design suite produced by Agilent. The single quarter-wave resonator network 300 in FIG. 3A comprises a first element 302, a second element 304, a line 306 and a third element 308. In one embodiment, the first element 302 comprises a microstrip open-circuit line (Model of a Microstrip Line with one end Open-Circuit (MLOC)) with a width W of 1.2 mm and a negligible length, such as $1 \times 10^{-3}$ mm. In one configuration, the first element 302 is associated with a Transmission Line reference number 8 (TL8).

In one embodiment, the second element 304 in FIG. 3A comprises a microstrip line (Model of a Microstrip Line (MLIN)) with a width W of 1.2 mm and a length L of 21.3 mm. In one configuration, the second element 304 is associated with a Transmission Line reference number 7 (TL7). The line 306 comprises a connection line with no significant physical dimensions.

In one embodiment, the third element 308 comprises a load impedance that mimics the effect of a 50-ohm input port of a measurement instrument, such as a network analyzer. In one configuration, the third element 308 is associated with a Termination Model Reference Number 1 (TERM1) with a Port Number 1 for S-parameter measurement (NUM=1).

Figure 4A:
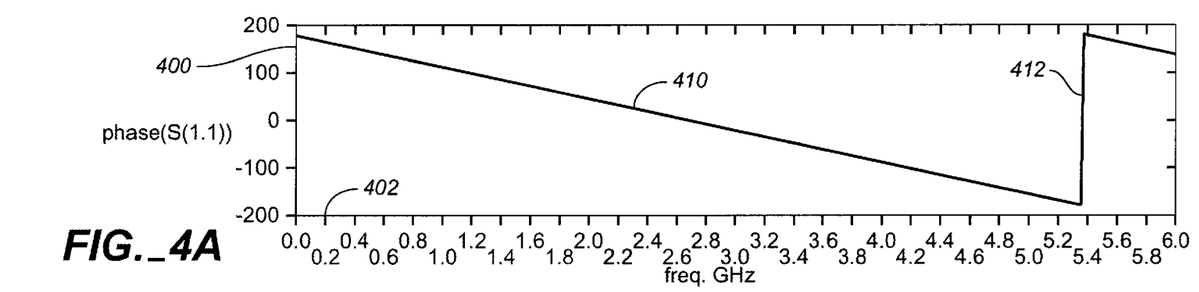
FIG. 4A illustrates a phase difference between injected and reflected signals (a reflected-signal phase response) of one embodiment of the single quarter-wave resonator network of FIG. 3A.

In operation, the third element 308 in FIG. 3A injects a low-level signal at a specific frequency to the first and second elements 302, 304 via line 306. When the network 300 created by the first and second elements 302 and 304 receives the signal, a certain amount of the signal is reflected back to the third element 308 via line 306. The third element 308 measures the reflected signal. This process is performed for a certain amount of discrete frequencies within a specified frequency range, such as 0 to 6 GHz. The difference in phase between the injected and reflected signals is shown in FIG. 4A.

Figure 3B:
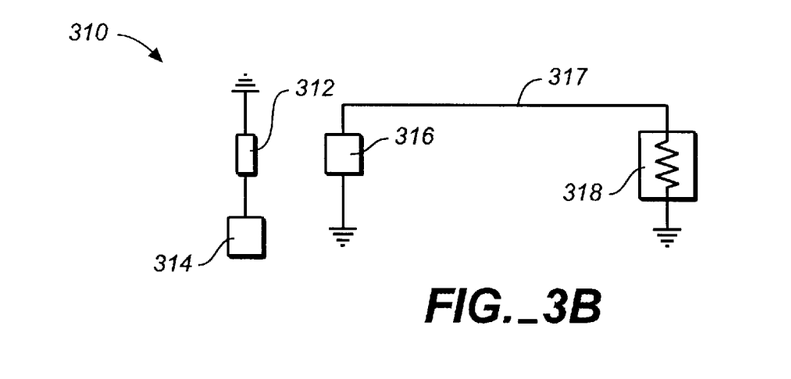
FIG. 3B illustrates an ADS schematic of one embodiment of a two-finger interdigital filter network.

FIG. 3B illustrates an ADS schematic of one embodiment of a two-finger interdigital filter network 310. The interdigital filter network 310 in FIG. 3B comprises a first element 312, a second element 314, a third element 316, a line 317 and a fourth element 318. In one embodiment, the first and third elements 312, 316 in FIG. 3B comprise parts of a Microstrip Asymmetric Coupled Lines (MACLIN) model, which comprises two microstrip tracks of widths W1 and W2, respectively, a length L, and separated by a spacing S. In one embodiment, W1 is equal to 1.2 mm, W2 is equal to 1.2 mm, S is equal to 0.18 mm, and L is equal to 21.3 mm. In one configuration, the first and third elements 312, 316 are associated with a MACLIN reference designator of CLin2.

In one embodiment, the second element 314 in FIG. 3B comprises a MLOC with a width W of 1.2 mm and a negligible length, such as $1 \times 10^{-3}$ mm. In one configuration, the second element 314 is associated with a Transmission Line reference number 9 (TL9). The line 317 comprises a connection line with no significant physical dimensions.

In one embodiment, the fourth element 318 in FIG. 3B comprises a load impedance that mimics the effect of a 50-ohm input port of a measurement instrument, such as a network analyzer. In one configuration, the fourth element 318 is associated with a Termination Model Reference Number 2 (TERM2) with a Port Number 2 for S-parameter measurement (NUM=2).

Figure 4B:
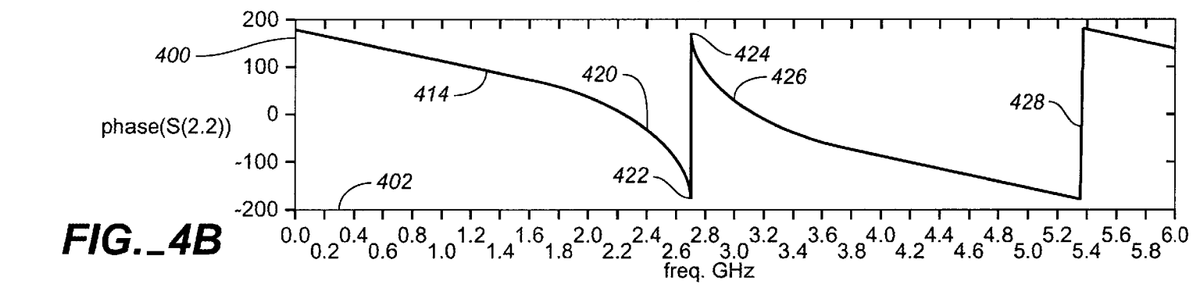
FIG. 4B illustrates a phase difference between injected and reflected signals (a reflected-signal phase response) of one embodiment of the two-finger interdigital filter network of FIG. 3B.

In operation, the fourth element 318 injects a low-level signal at a specific frequency to the third element 316 via line 317. When the network created by the first, second and third elements 312, 314, 316 receives the signal, a certain amount of the signal is reflected back to the fourth element 318 via line 317. The fourth element 318 measures the reflected signal. This process is performed for a certain amount of discrete frequencies within a specified frequency range, such as 0 to 6 GHz. The difference in phase between the injected and reflected signals is shown in FIG. 4B.

Figure 3C:
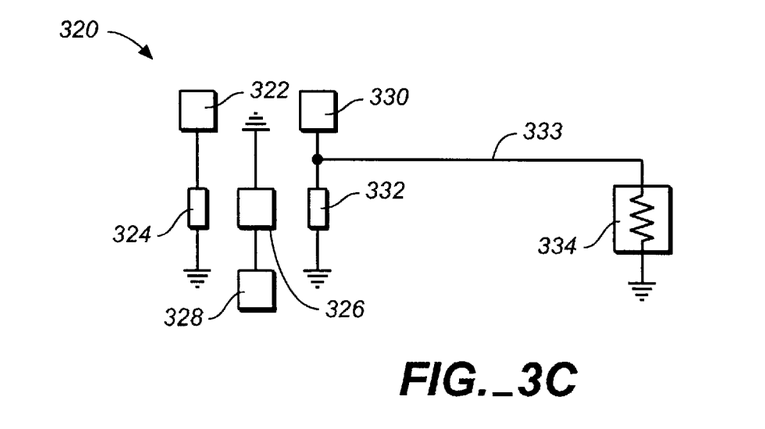
FIG. 3C illustrates an ADS schematic of one embodiment of a three-finger interdigital filter network.

FIG. 3C illustrates an ADS schematic of one embodiment of a three-finger interdigital filter network 320. The interdigital filter network 320 in FIG. 3C comprises a first element 322, a second element 324, a third element 326, a fourth element 328, a fifth element 330, a sixth element 332, a line 333 and a seventh element 334.

In one embodiment, the first, fourth and fifth elements 322, 328, 330 in FIG. 3C each comprise a MLOC with a width W of 1.2 mm and a negligible length, such as $1 \times 10^{-3}$ mm. In one configuration, the first with Transmission Line reference numbers 2, 6 and 5 (TL2, TL6 and TL5), respectively.

In one embodiment, the second, third and sixth elements 324, 326, 332 in FIG. 3C comprise parts of a MACLIN model, which comprises three microstrip tracks of widths W1, W2, and W3, respectively, and a length L. The second and third elements 324, 326 are separated by a first spacing S1. The third and sixth elements 326, 332 are separated by a second spacing S2. In one embodiment, W1 and W3 are each equal to 1.2 mm, W2 is equal to 2.5 mm, S1 and S2 are each equal to 0.18 mm, and L is equal to 21.3 mm. In other embodiments, W1 and W3 may not be equal and/or S1 and S may not be equal. In one configuration, the second, third and sixth elements 324, 326, 332 are associated with a MACLIN reference designator of MACLIN3. The line 333 comprises a connection line with no significant physical dimensions.

In one embodiment, the seventh element 334 in FIG. 3C comprises a load impedance that mimics the effect of a 50-ohm input port of a measurement instrument, such as a network analyzer. In one configuration, the seventh element 334 is associated with a Termination Model Reference Number 3 (TERM3) with a Port Number 3 for S-parameter measurement (NUM=3).

In operation, the seventh element 334 injects a low-level signal at a specific frequency to the fifth and sixth elements 330, 332 via line 333. When the network created by the first, second, third, fourth, fifth and sixth elements 322, 324, 326, 328, 330, 332 receives the signal, a certain amount of the signal is reflected back to the seventh element 334 via line 333. The seventh element 334 measures the reflected signal. This process is performed for a certain amount of discrete frequencies within a specified frequency range, such as 0 to 6 GHz. The difference in phase between the injected and reflected signals is shown in FIG. 4C.

FIG. 4A illustrates a phase difference between injected and reflected signals (a reflected-signal phase response) of one embodiment of the single quarter-wave resonator network 300 of FIG. 3A. The phase difference is measured by the third element 308 in FIG. 3A. The x-axis 402 in FIG. 4A comprises a frequency range of the injected signal, and the y-axis 400 comprises the phase difference between the injected and the reflected signals. The phase difference is plotted from −180 to +180 degrees with a line 410. If the phase difference changes from −179 to +179 degrees, for example, a vertical line, such as a line 412 in FIG. 4A, will appear. Other than the line 412, the rate of change of the phase difference is substantially constant, and there are no areas of increased rate of phase difference change in FIG. 4A.

FIG. 4B illustrates a phase difference between injected and reflected signals (a reflected-signal phase response) of one embodiment of the two-finger interdigital filter network 310 of FIG. 3B. The phase difference is measured by the fourth element 318 in FIG. 3B. The phase difference is plotted from −180 to +180 degrees with a line 414. In FIG. 4B, there is a frequency range associated with a high rate of phase difference change. The frequency range is between about 2.4 GHz (point 420) and about 3GHz (point 426). The steepest slope occurs at ±180 degrees (points 422, 424), which is expected (but unfortunate that the software simulator chooses this point to swap between negative and positive degrees).

Figure 4C:
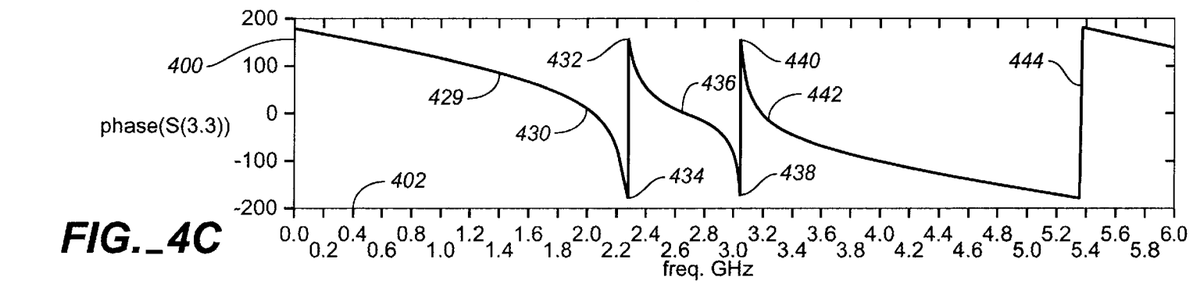
FIG. 4C illustrates a phase difference between injected and reflected signals (a reflected-signal phase response) of one embodiment of the three-finger interdigital filter network of FIG. 3C.

FIG. 4C illustrates a phase difference between injected and reflected signals (a reflected-signal phase response) of one embodiment of the three-finger interdigital filter network 320 of FIG. 3C. The phase difference is measured by the seventh element 334 in FIG. 3C. The phase difference is plotted from −180 to +180 degrees with a line 429. In FIG. 4C, there are two frequency ranges associated with a high rate of phase difference change. The first frequency range is between about 2.0 GHz (point 430) and about 2.7 GHz (point 436). The second frequency range is between about 2.7 GHz (point 436) and about 3.3 GHz (point 442). In FIG. 4C, the highest rate of phase difference change (steepest slopes) occur at ±180 degrees at points 432, 434, 438 and 440.

The resonator 102 in FIG. 1 may be observed as a one-port network with a 3-finger interdigital filter, such as the network 320 in FIG. 3C. When the resonator 102 is observed as the network 320, there are two frequency ranges (from point 430 to point 436 and from point 436 to point 442) associated with a high rate of phase difference change, as described above with reference to FIG. 4C. The two frequency ranges associated with a high rate of phase difference change are caused by two poles of the filter 320 in FIG. 3C (and the resonator 102 in FIG. 1). The two frequency ranges are near a required (desired) oscillation frequency of the resonator 102.

In one embodiment, the lower frequency range (between about 2.0 GHz (point 430) and about 2.7 GHz (point 436)) associated with a high rate of phase difference change is configured to provide the highest rate of phase difference change possible and the lowest insertion loss possible. Insertion loss represents an amount of power lost as a signal passes through a device, such as the resonator 102. A network that exhibits a high rate of phase difference change and low insertion loss will inherently have a high unloaded Q. As shown below, maximizing the unloaded Q of a resonator in Leesons' phase noise equation will minimize phase noise.

$$L(f) = \frac{1}{2}\left[ + \frac{\omega o^2}{4\omega_m^2}\left(\frac{Pin}{\omega o We} + \frac{1}{Qunl} + \frac{Psig}{\omega o We}\right)^2\right]\left(1 + \frac{\omega c}{\omega m}\right)\frac{F\kappa To}{Pavs}$$

L(f)=phase noise at a frequency offset f
ωo=oscillator frequency
ωm=offset frequency
Pin=input power
We=reactive energy
Qunl=unloaded Q Psig=signal power ωc=flicker noise corner frequency F=frequency κ=Boltman's Constant To=temperature Pavs=noise-free power source Negative Resistance Generator A negative resistance may be considered a source of electrical energy. A negative resistance implies that a device is active. The negative resistance generator 104 in FIG. 1 amplifies the reflected signal from the resonator 102 and injects the signal back into the resonator 102. The phase response of the negative resistance generator 104 is configured to cancel the phase response of the interdigital filter in the resonator 102 where a maximum rate of phase difference change occurs, such as points 432, 434 (FIG. 4C) and/or between points 432, 434.

Structurally, the negative resistance generator 104 in FIG. 1 comprises a second capacitor 124, a third capacitor 126, a first resistor 128, a second resistor 130, a third resistor 140, a fourth capacitor 178, an active device or active element 150, a fourth resistor 132, a fifth resistor 152, a fifth capacitor 134, a sixth capacitor 138, a voltage supply 136, a seventh capacitor 144, an eighth capacitor 146, a ninth capacitor 148, and an output port 154. In one embodiment, the output port 154 is further coupled to a sixth resistor 170, a seventh resistor 172 and an eighth resistor 174.

In one embodiment, the second, fourth and ninth capacitors 124, 178, 148 in FIG. 1 each comprise a 0.8-pF ATC600S capacitor. The third capacitor 126 comprises a 1-nF capacitor. The fifth capacitor 134 comprises a 10-pF capacitor. The sixth capacitor 138 comprises a 100-nF capacitor. The seventh capacitor 144 comprises a 10-pF ATC600S capacitor. The eighth capacitor 146 comprises a 0.3-pF ATC600S capacitor. The ninth capacitor 148 comprises a 0.8-pF ATC600S capacitor.

In one embodiment, the first resistor 128 comprises a 2.0-kohm or a 2.7-kohm resistor. The second resistor 130 comprises a 5-kohm or 5.6-kohm resistor. The third resistor 140 comprises a 1-kohm resistor. The fourth and fifth resistors 132, 152 each comprise a 180-ohm resistor. The sixth and eighth resistors 170, 174 each comprise a 150R-ohm resistor, and the seventh resistor 172 comprises a 39-ohm resistor.

In one embodiment, the active element 150 in FIG. 1 comprises a npn bipolar junction transistor (BJT). In one configuration, the active element 150 comprises an NE68135 transistor (TR2) used in a standard common-collector configuration. In other embodiments, other types of active elements, such as a diode, metal oxide semiconductor field-effect transistor (MOSFET), a GaAs FET, a JFET or other types of FETs, may be implemented with various bias conditions instead of or in addition to a BJT. In one embodiment, the voltage supply 136 provides 10 volts. In other embodiments, the voltage supply provides more than or less than 10 volts.

In one embodiment, the first, second, fourth and fifth resistors 128, 130, 132, 152 set a DC bias voltage across collector and emitter terminals Vce equal to 5V and a collector current Ic equal to 14 mA. The seventh capacitor 144 produces a RF ground at one terminal of the active element 150, e.g., the collector terminal of a transistor. The fourth and ninth capacitors 178, 148 are selected to provide a desired negative resistance, as described below. The eighth capacitor 146 lightly couples some of the oscillator signal to the output port 154. The third, fifth and sixth capacitors 130, 134, 138 decouple the voltage supply line 136.

In operation, when a signal at a specific frequency is applied to an input port 180 of the negative resistance generator 104 in FIG. 1, a signal with the same frequency but with a higher magnitude will be output at the same port 180. In other words, a reflection-transmission coefficient $S_{11}$ of the negative resistance generator 104 will be greater than zero, $S_{11}>0$. The reflection coefficient is the amount of reflected voltage or current divided by the incident (injected) voltage or current. Those of ordinary skill in the art may use a Smith chart to plot normalized impedance with the angle and magnitude of a generalized complex reflection coefficient in a unity circle. If the reflection-transmission coefficient $S_{11}$ of the negative resistance generator 104 is viewed on a standard Smith chart over a large frequency range, all frequencies that have negative resistance will be outside the standard Smith chart and are typically plotted on a 'compressed' or 'extended' Smith chart.

By using a transformation $S_{11}'=1/S_{11}$, however, $S_{11}'$ can be plotted on a standard Smith chart (see FIG. 5A), and all frequencies that have negative resistance will appear inside the Smith chart. But the direction of rotation on the Smith chart for increasing frequencies with negative resistance will be reversed, i.e., the direction of rotation will be opposite to the direction of rotation for increasing frequencies with positive resistance.

Figure 5A:
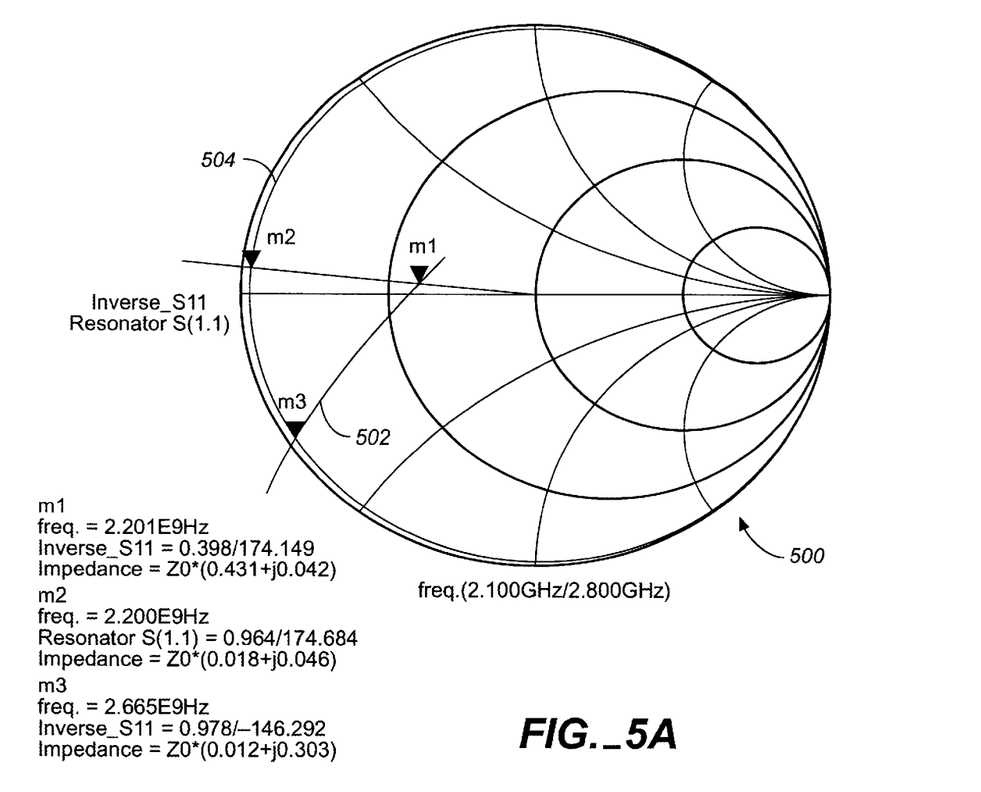
FIG. 5A illustrates an example of a Smith chart with a $S_{11}$ response plot of the resonator in FIG. 1 and a $S_{11}'$ response plot of the negative resistance generator in FIG. 1.

FIG. 5A illustrates an example of a Smith chart with a $S_{11}$ response plot 504 of the resonator 102 in FIG. 1 and a $S_{11}'$ response plot 502 of the negative resistance generator 104. In FIG. 5A, any area where the response 502 of the negative resistance generator 104 is inside the response 504 of the resonator 102, and the two responses 502, 504 have the same phase, the conditions for oscillation are satisfied. Conditions for oscillation can be described with reference to FIG. 6.

Figure 6:
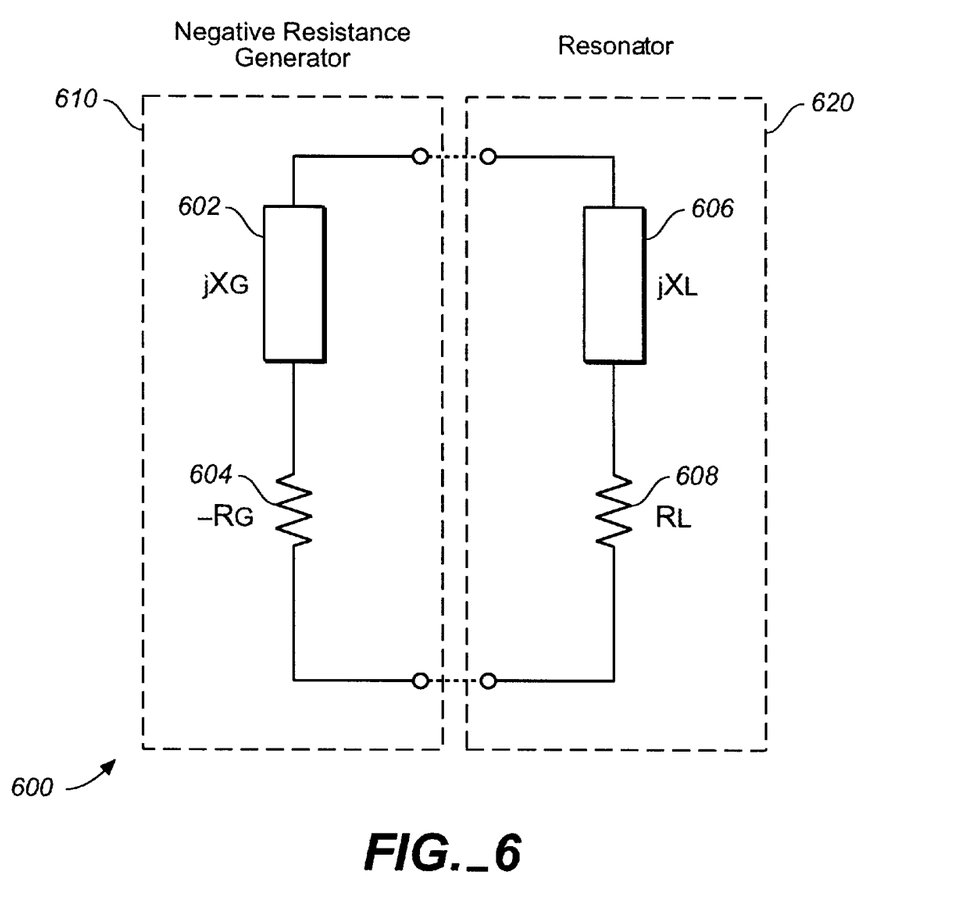
FIG. 6 illustrates a simplified diagram of the resonator and the negative resistance generator of FIG. 1.

FIG. 6 illustrates a simplified diagram 600 of the resonator 102 and the negative resistance generator 104 of FIG. 1. The negative resistance generator 104 in FIG. 1 may be converted into an equivalent negative resistance generator circuit 610, which comprises a negative resistance $-R_G$ and a reactance $jX_G$. The resonator 102 in FIG. 1 may be converted into an equivalent resonator circuit 620, which comprises a resistance $R_L$ and a reactance $jX_L$. If the resonator 620 and the negative resistance generator 610 are coupled together, oscillations can be sustained at each frequency where the following two conditions are satisfied: $R_L-R_G=0$ and $X_G+X_L=0$. In addition, one condition for reliable oscillation start-up may be $|R_G|>1.2\ R_L$ (impedance mismatch).

In FIG. 5A, a first marker m1 is on the $S_{11}'$ response plot 502 of the negative resistance generator 104, and a second marker m2 is on the $S_{11}$ response plot 504 of the resonator 102. For one embodiment of the VCO 100, the phase and frequency of both responses $S_{11}$ and $S_{11}'$ are substantially identical at markers m1 and m2 in FIG. 5A. In one embodiment, the frequency at m1 is equal to 2.201 GHz, the $S_{11}'$ response is equal to 0.398/174.149, and the impedance is equal to $Z0*(0.431+j0.042)$, where Z0 is a characteristic impedance. If the $S_{11}'$ response at m1 is converted to a $S_{11}$ response using the equation $S_{11}=1/S_{11}'$, then the impedance is equal to $Z0*(-0.433-j0.043)$. In one embodiment, the frequency at m2 is equal to 2.200 GHz, the $S_{11}$ response is equal to 0.978/174.684, and the impedance is equal to $Z0*(0.018+j0.046)$.

With the first and second markers m1 and m2, $X_G+X_L=-0.043+0.046$ which is almost equal to zero. The 0.003 error occurs because the markers m1, m2 are on slightly different frequency points which is due to the way the software performs the simulation. In addition, the absolute value $R_G$ (0.433) of is much greater than $R_L$ (0.018) for the VCO 100 in FIG. 1. Thus, the conditions for oscillation start-up for the VCO 100 are satisfied at m1 and m2.

To provide optimum low phase noise performance, i.e., to minimize phase noise, the phase where the resonator $S_{11}$ response 502 and the negative resistance generator $S_{11}'$ response 504 are the same (at markers m1 and m2) should occur at the point of maximum rate of phase difference change, such as the points 432 and 434 in FIG. 4C.

Most VCOs are configured to oscillate at only one frequency at a time. Thus, in one embodiment of a VCO, the conditions for oscillation should be met only once. The 3-finger interdigital resonator 102 in FIG. 1 has a $S_{11}$ response with two narrow frequency ranges (between points 434 and 432 in FIG. 4C and between points 438 and 440) of high rate of phase difference change. To provide only one frequency of oscillation, the negative resistance generator 104 in FIG. 1 is configured to generate (1) a sufficient negative resistance for at least the first frequency range (between points 434 and 432) of high rate of phase difference change and (2) a positive resistance for at least the second frequency range (between points 438 and 440). Thus, the conditions for oscillation in the second frequency range (between points 438 and 440) are not satisfied.

In one embodiment, the negative resistance generator 104 is configured to generate a negative resistance only up to a maximum frequency that is below the frequency at point 438 in FIG. 4C associated with the second pole of the interdigital filter response of the resonator 102. Simultaneously, the phase response of the negative resistance generator 104 is configured to cancel the phase response of the interdigital filter in the resonator 102 between points 434 and 432 where maximum rate of phase difference change occurs.

A third marker m3 in FIG. 5A denotes the highest frequency where negative resistance is generated in one embodiment. In one embodiment, the frequency at m3 is equal to 2.665 GHz, the $S_{11}'$ response at m3 is equal to 0.978/−146.292, and the impedance at m3 is equal to Z0* (0.012+j0.303). As shown in FIG. 4C, 2.665 GHz is below the frequency of the point 438, where the second narrow frequency range of high rate of phase difference change begins.

Figure 5B:
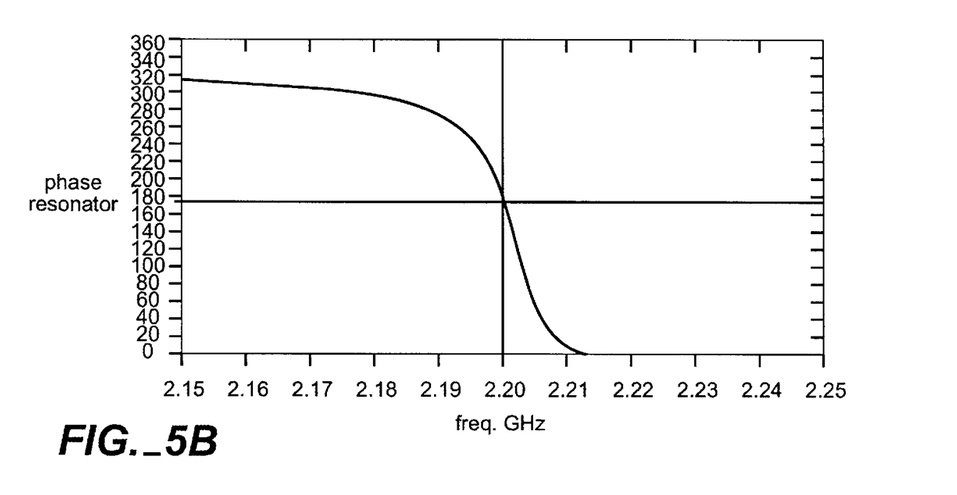
FIG. 5B illustrates a phase response of one embodiment of the resonator in FIG. 1 plotted with respect to oscillation frequency.

FIG. 5B illustrates a phase of one embodiment of the resonator 102 in FIG. 1 plotted with respect to oscillation frequency in GHz. As shown in FIG. 5B, the phase of the resonator 102 is about 180 degrees at a frequency of 2.20 GHz.

The above-described embodiments of the present invention are merely meant to be illustrative and not limiting. Various changes and modifications may be made without departing from the invention in its broader aspects. For example, the resonator 102 and/or the negative resistance generator 104 in FIG. 1 may be designed in various ways with other types and/or values of capacitors, resistors, inductors, varactors, substrates and resonator dimensions in accordance with the present invention. The appended claims encompass such changes and modifications within the scope of the invention.

What is claimed is:

1. A voltage-controlled oscillator comprising:
   a resonator comprising a three-finger interdigital filter and a plurality of varactors, a first varactor coupled to a first finger of the interdigital filter and a ground terminal, a second varactor coupled to a third finger of the interdigital filter and a ground terminal, a second finger of the interdigital filter coupled to a ground terminal, wherein the first and second varactors are configured to alter a resonant frequency of the interdigital filter to a desired frequency in response to a tuning voltage applied to the resonator; and
   a negative resistance generator coupled to the resonator, the negative resistance generator configured to receive a first signal from the resonator, the first signal having a frequency, the negative resistance generator configured to output a second signal, the second signal having a substantially similar frequency and a higher amplitude compared to the first signal.

2. The voltage-controlled oscillator of claim 1, wherein the first and second varactors comprise silicon varactor diodes.

3. The voltage-controlled oscillator of claim 1, wherein the resonator further comprises a third varactor and a fourth varactor, the third varactor coupled to the first interdigital filter finger and a ground terminal, the fourth varactor coupled to the third interdigital filter finger and a ground terminal.

4. The voltage-controlled oscillator of claim 1, wherein the first interdigital filter finger comprises a 1.2 mm×21 mm microstrip 50 ohm track, the second interdigital filter finger comprises a 2.5 mm×21 mm microstrip 30 ohm track, and the third interdigital filter finger comprises a 1.2 mm×21 mm microstrip 50 ohm track.

5. The voltage-controlled oscillator of claim 1, wherein the first and second interdigital filter fingers are separated by a spacing of 0.18 mm, and the second and third interdigital filter finger are separated by a spacing of 0.18 mm.

6. The voltage-controlled oscillator of claim 1, wherein the first, second and third interdigital filter fingers are implemented on a 0.5 mm teflon substrate.

7. The voltage-controlled oscillator of claim 1, wherein the resonator and the negative resistance generator comprise a microstrip circuit etched on a 0.5 mm-thick, double-sided, teflon laminate.

8. The voltage-controlled oscillator of claim 1, wherein the resonator further comprises a first radiofrequency choke coupled to the first interdigital filter finger and a second radiofrequency choke coupled to the third interdigital filter finger.

9. The voltage-controlled oscillator of claim 8, wherein the resonator further comprises a capacitor coupled to the first and second radiofrequency chokes and a ground terminal.

10. The voltage-controlled oscillator of claim 1, wherein the tuning voltage is between about 0 volts to about 6 volts.

11. The voltage-controlled oscillator of claim 1, wherein the negative resistance generator comprises a transistor configured in a common-collector configuration, at least one resistor and at least one capacitor.

12. The voltage-controlled oscillator of claim 1, wherein the negative resistance generator comprises a diode, at least one resistor and at least one capacitor.

13. The voltage-controlled oscillator of claim 1, wherein the negative resistance generator comprises a metal oxide semiconductor field-effect transistor, at least one resistor and at least one capacitor.

14. The voltage-controlled oscillator of claim 1, wherein the negative resistance generator is configured to generate a negative resistance for a first frequency range associated with a high rate of phase difference change of the resonator and a positive resistance for a second frequency range associated with a high rate of phase difference change of the resonator.

15. The voltage-controlled oscillator of claim 1, wherein the negative resistance generator is configured to generate a negative resistance only up to a maximum frequency that is below a frequency associated with a pole of an interdigital filter response of the resonator.

16. The voltage-controlled oscillator of claim 1, wherein a phase response of the negative resistance generator is configured to cancel the phase response of the interdigital filter in the resonator for a frequency range of the resonator associated with a high rate of phase difference change.

17. The voltage-controlled oscillator of claim 1, wherein the resonator and the negative resistance generator are configured to provide an oscillating signal at a desired oscillation frequency.

18. A method of generating an oscillating signal at a desired frequency, the method comprising:

applying a tuning voltage to a resonator, the resonator comprising an interdigital filter and a plurality of varactors, the interdigital filter comprising a first finger, a second finger and a third finger, the first finger coupled to a first varactor and the third finger coupled to a second varactor; and using the tuning voltage to alter a resonant frequency of the interdigital filter to generate a signal with a desired oscillation frequency.

19. The method of claim 18, further comprising amplifying the signal with a desired oscillation frequency.

20. The method of claim 18, further comprising generating a negative resistance for a first frequency range associated with a high rate of phase difference change of the resonator and a positive resistance for a second frequency range associated with a high rate of phase difference change of the resonator.

21. The method of claim 18, further comprising generating a negative resistance only up to a maximum frequency that is below a frequency associated with a pole of an interdigital filter response of the resonator.

22. The method of claim 18, further comprising canceling the phase response of the resonator for a frequency range of the resonator associated with a high rate of phase difference change.

* * * * *